United States Patent [19]

Serizawa et al.

[11] Patent Number: 5,408,698
[45] Date of Patent: Apr. 18, 1995

[54] RADIO TELE-COMMUNICATION DEVICE HAVING FUNCTION OF VARIABLY CONTROLLING RECEIVED SIGNAL LEVEL

[75] Inventors: Mutsumu Serizawa, Tokyo; Kazuhiro Kawashima, Yokohama, both of Japan

[73] Assignee: Kabushiki Kaisha Toshiba, Kawasaki, Japan

[21] Appl. No.: 856,249

[22] Filed: Mar. 25, 1992

[30] Foreign Application Priority Data

Mar. 26, 1991 [JP] Japan .................................. 3-061911

[51] Int. Cl.$^6$ .............................................. H04B 1/06
[52] U.S. Cl. ............................... 455/245.1; 455/240.1; 455/246.1; 375/345
[58] Field of Search ................ 455/234.1, 234.2, 240.1, 455/249.1, 245.1, 246.1; 375/80, 94, 95, 98, 22

[56] References Cited

U.S. PATENT DOCUMENTS

| | | | |
|---|---|---|---|
| 3,080,524 | 3/1963 | Davey et al. | 455/234.1 |
| 4,607,215 | 8/1986 | Takano et al. | 455/249.1 |
| 4,931,751 | 6/1990 | Keller et al. | 375/22 |
| 4,989,074 | 1/1991 | Matsumoto | 455/234.1 X |
| 5,142,695 | 8/1992 | Roberts et al. | 455/234.1 |

*Primary Examiner*—Edward F. Urban
*Attorney, Agent, or Firm*—Banner, Birch, McKie & Beckett

[57] ABSTRACT

A level changing circuit is provided in a reception signal path for a radio signal and a level detection circuit and a pulse width modulation circuit are provided in a gain control circuit. A level corresponding to the amplitude level of a signal processed by a digital demodulation circuit is detected by the level detection circuit and a pulse signal whose pulse width is modulated according to the detected signal level is generated from the pulse width modulation circuit. Then, a gain control signal having a D.C. level corresponding to the pulse signal is generated and the gain of the level changing circuit is controlled according to the gain control signal, thereby making it possible to control the level of the received signal.

19 Claims, 5 Drawing Sheets

RADIO TELE-COMMUNICATION DEVICE HAVING FUNCTION OF VARIABLY CONTROLLING RECEIVED SIGNAL LEVEL

BACKGROUND OF THE INVENTION

1. Field of the Invention

This invention relates to a radio tele-communication device used in a mobile radio tele-communication system such as a portable type car radio telephone system, cordless radio telephone system or paging system and more particularly to a radio tele-communication device having a variable gain controlling function for stabilizing the amplitude level of a received signal.

2. Description of the Related Art

In a mobile radio tele-communication device, the level of a received signal may be varied by the influence of fading and the gain of a circuit may be varied by the environmental variation or the like. Therefore, in general, a variable gain control circuit is provided in the reception circuit system of the mobile radio device.

The reception circuit system of the mobile radio device having the variable gain control circuit provided therein is constructed as follows, for example. That is, a high-frequency signal received by an antenna is converted into an intermediate frequency signal by means of a frequency conversion circuit and then the amplitude level thereof is variably controlled by a variable gain amplifier. A signal output from the variable gain amplifier is converted into a digital signal by an analog/digital (A/D) converter so that it can be input to a digital demodulation circuit. In the digital demodulation circuit, the operation of demodulating a digital intermediate frequency signal input from the A/D converter into a base band signal is effected. Part of the demodulated base band signal is input to a level detection circuit. In the level detection circuit, the amplitude level of the base band signal is detected. A detection signal of the detected amplitude level output from the level detection circuit is converted into an analog signal by a digital/analog (D/A) converter. The thus converted detection signal is supplied as a gain control signal to the variable gain amplifier. The gain of the variable gain amplifier is variably controlled by the gain control signal.

However, in the above conventional variable gain control circuit, the D/A converter is used to derive the gain control signal. Therefore, the circuit scale of the reception circuit system is enlarged, the power consumption is increased and the number of pins used when the circuit is formed in a large integrated circuit (LSI) configuration is increased so as to increase the size of the radio communication device. The problems are extremely undesirable in a portable type mobile radio communication device using a battery as a power source since the portability thereof is lowered and the service life of the battery is shortened.

SUMMARY OF THE INVENTION

A first object of this invention is to provide a radio tele-communication device in which a gain control signal can be derived without using a D/A converter so as to reduce the circuit scale, lower the power consumption and reduce the number of pins used when the device is formed in an integrated circuit configuration, thereby reducing the size and weight of the device and making the service life of a battery long.

A second object of this invention is to provide a radio tele-communication device capable of detecting the amplitude level of a received signal with high sensitivity so as to effect the variable gain control with high precision.

A third object of this invention is to provide a radio tele-communication device which is prevented from responding to temporary variation in the amplitude of a received signal so as to effect the stable variable gain control.

A fourth object of this invention is to provide a radio tele-communication device in which a level changing means can be formed of a circuit of relatively simple construction and whose power consumption can be reduced.

The first object can be attained by a radio tele-communication device comprising a gain control circuit; a level detection circuit; and a pulse width modulation circuit. The level detection circuit is used to detect the level of a signal processed by a digital demodulation circuit and a pulse signal whose pulse width is modulated according to the detected signal level is supplied from the pulse width modulation circuit. Then, a gain control signal having a D.C. level corresponding to the pulse signal is supplied to control the gain of the level changing circuit.

According to this invention, since a gain control signal is generated by use of the pulse width modulation circuit, the circuit scale of the gain control circuit can be made smaller in comparison with a case wherein a D/A converter is used. Further, the number of pins of an integrated circuit formed when the digital modulation/demodulation circuit is formed in an integrated circuit configuration can be reduced and therefore the circuit construction can be made small and simple. As a result, the mobile radio tele-communication device can be made smaller and lighter. It is also possible to reduce the power consumption of the gain control circuit. Therefore, the service life of the battery can be elongated so as to extend the continuous operation time or the capacity of the battery can be reduced to make the battery small so as to further reduce the size and weight of the mobile radio tele-communication device.

Further, in order to attain the second object of this invention, the level changing circuit is coupled to a final stage frequency converter of a plurality of frequency converters of the frequency converting circuit in a case where the frequency converting circuit is formed of the plurality of series-connected frequency converters.

With the above construction, it becomes unnecessary to use an amplifier having a performance for processing high frequency waves as the level changing circuit. Therefore, the level changing circuit can be formed of a circuit of relatively simple construction and the power consumption thereof can be suppressed to a small value.

Further, in order to attain the third object of this invention, the peak value of a detection signal output from a synchronizing signal detection circuit is detected by means of the level detection circuit and a gain control signal is derived according to the detected peak value in a case where the demodulation section includes the synchronizing signal detection circuit for detecting preset synchronizing signals periodically contained in a received signal.

As a result, according to this invention, since the gain control signal is derived according to the peak value of the synchronization detection signal, the signal level of the received signal can be detected with higher sensitivity in comparison with a case wherein the amplitude level of the digital demodulation signal is directly detected.

Further, in order to attain the fourth object of this invention, the peak value of the detection signal output from the synchronizing signal detection circuit of the demodulation section is periodically detected by use of the level detection circuit, the average value of a plurality of detected peak values is derived by means of an averaging circuit and a gain control signal is derived based on the average value.

As a result, according to this invention, even when the level of the received signal is temporarily significantly changed by simultaneous interruption of radio waves or introduction of noises, for example, and consequently the peak value of the synchronization detection signal is temporarily significantly changed, the gain control signal can be prevented from varying in response to the temporary variation and thus the stability of the gain control can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

(FIRST EMBODIMENT)

Figure 1:
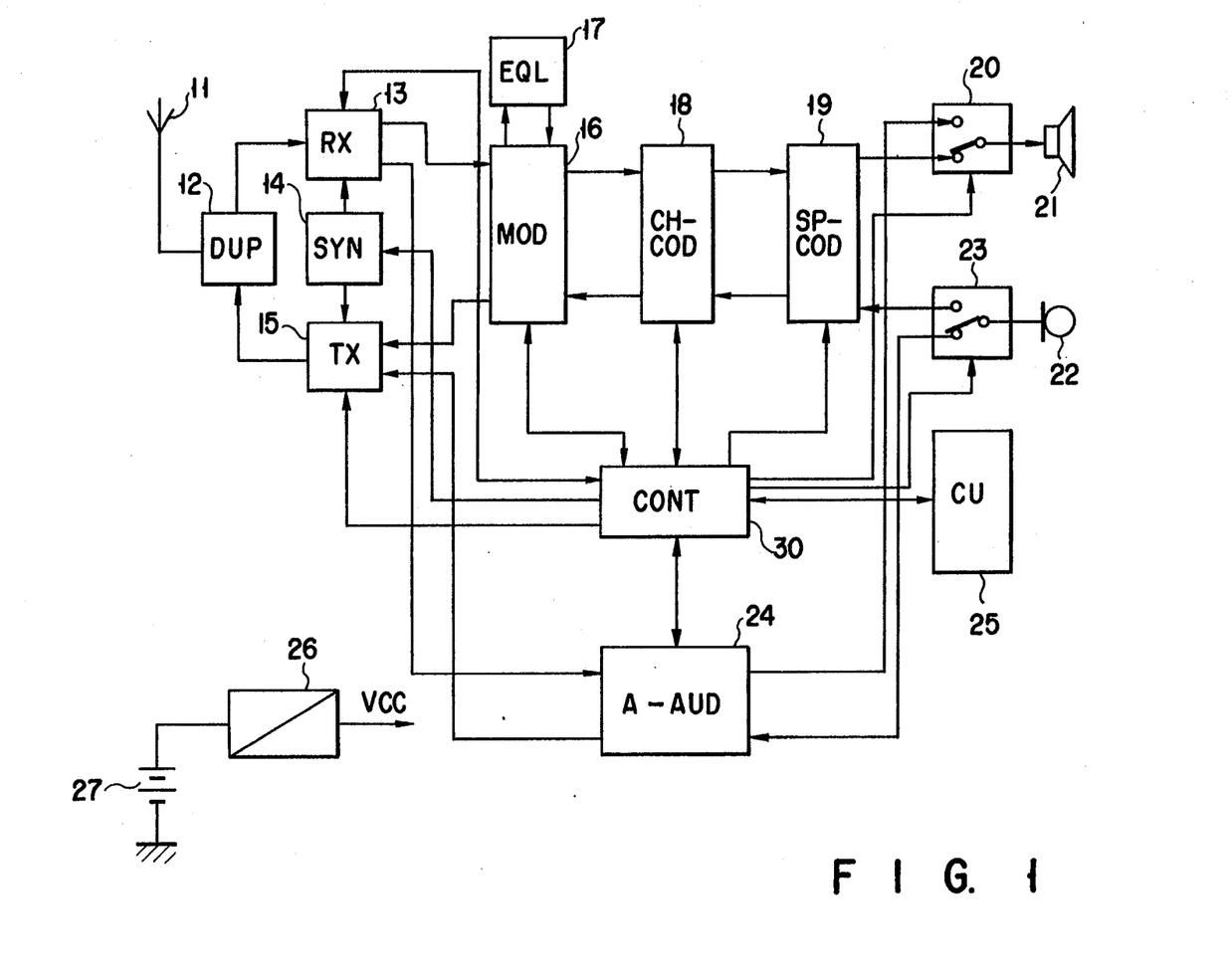
FIG. 1 is a block diagram showing the construction of a mobile radio tele-communication device having a variable gain control circuit according to a first embodiment of this invention.

FIG. 1 is a block diagram showing the construction of a mobile radio tele-communication device according to a first embodiment of this invention.

The mobile radio tele-communication device of this embodiment is a dual mode type radio tele-communication device. The dual mode indicates a system in which the radio communication is effected by selectively using an analog mode or a digital mode. In the analog mode, a carrier is FM-modulated, for example, by an analog audio signal in a transmission circuit and then transmitted. In the digital mode, an audio signal is converted into a digital signal and then a carrier is modulated by the digital audio signal by use of a digital modulation system such as a $\pi/4$ shifted Quadrature Phase Shift Keying ($\pi/4$ shifted QPSK) modulation system and is then transmitted.

When the digital mode is set, audio switches 20 and 23 are connected to an audio code demodulation circuit 19 according to an instruction of a control circuit 30. A radio communication signal transmitted from a base station (not shown) is received by an antenna 11 and then input to a reception circuit (RX) 13 via a duplexer (DUP) 12. In the reception circuit 13, the received radio communication signal is mixed with a local oscillation signal generated from a frequency synthesizer (SYN) 14 and converted into an intermediate frequency signal. The received intermediate frequency signal is input to a digital modulation/demodulation circuit (MOD) 16. In the digital modulation/demodulation circuit 16, the operation of converting the received intermediate frequency signal into a digital form, the demodulation operation, the operation of setting up the bit synchronization and slot synchronization and the like are effected. A signal associated with the slot synchronization is input to the control circuit (CONT) 30. The digital modulation/demodulation circuit 16 is provided with an equalizer (EQL) 17. In the equalizer 17, the waveform equalizing operation for a demodulation signal demodulated by the digital modulation/demodulation circuit 16 is effected.

A digital demodulation signal output from the digital modulation/demodulation circuit 16 is input to an error correction code demodulation circuit (CH-COD) 18. In the error correction code demodulation circuit 18, the error correction code demodulating operation for the digital demodulation signal is effected. A digital demodulation signal output from the error correction code demodulation circuit 18 is input to the audio code demodulation circuit (SP-COD) 19. In the audio code demodulation circuit 19, the audio demodulating operation for the digital demodulation signal and the D/A conversion of the demodulated received signal are effected and thus an analog received signal is reproduced. The reproduced analog received signal is supplied to a speaker 21 via the audio switch 20 and is generated from the speaker 21 as a voice or sound.

A voice uttered from a speaker or talker is received by a microphone 22, converted into an analog transmission signal and then input to the audio code demodulation circuit 19 via the audio switch 23. In the audio code demodulation circuit 19, the analog transmission signal is converted into a digital form and coded. A digital transmission signal output from the audio code demodulation circuit 19 is input to the error correction code demodulation circuit 18 and is subjected to the error correction coding operation. In the digital modulation/demodulation circuit 16, an intermediate frequency signal which is modulated according to the digital transmission signal supplied from the error correction code demodulation circuit 18 is generated. For example, a $\pi/4$ shifted QPSK modulation system is used as the modulation system. In the transmission circuit 15, the modulated intermediate frequency signal is mixed with a local oscillation signal output from the frequency synthesizer 14 so as to be converted into a radio frequency signal and is then amplified by a high-frequency amplifier. The radio frequency signal output from the transmission circuit 15 is supplied to the antenna 11 via the duplexer 12 and then transmitted from the antenna 11 towards the base station.

When the analog mode is set, the audio switches 20 and 23 are connected to an analog audio processing circuit (A-AUD) 24 according to an instruction of the control circuit 30. In the analog audio processing circuit 24, a received intermediate frequency signal output from the reception circuit 13 is FM-modulated and thus an analog received signal is reproduced. The analog received signal is supplied to the speaker 21 via the audio switch 20 and is output from the speaker 21 as a voice or sound. A voice uttered from a speaker or talker is received by the microphone 22, converted into a transmission audio signal and then input to the analog audio processing circuit 24 via the audio switch 23. In the analog audio processing circuit 24, the intermediate frequency signal in transmission is FM-modulated by the analog transmission signal. The modulated intermediate frequency signal is input to the transmission circuit 15. In the transmission circuit 15, the modulated intermediate frequency signal is frequency-converted into a radio frequency signal and is then subjected to the high-frequency amplification. After this, the radio frequency signal output from the transmission circuit 15 is supplied to the antenna 11 via the duplexer 12 and then transmitted towards the base station from the antenna 11.

In a console unit 25, switches such as transmission switch and dial keys and a liquid crystal display unit (LCD) are provided. A power source circuit 26 creates a preset operation voltage Vcc based on an output voltage of a battery 27 and supplies the operation voltage to the above circuits.

Figure 2:
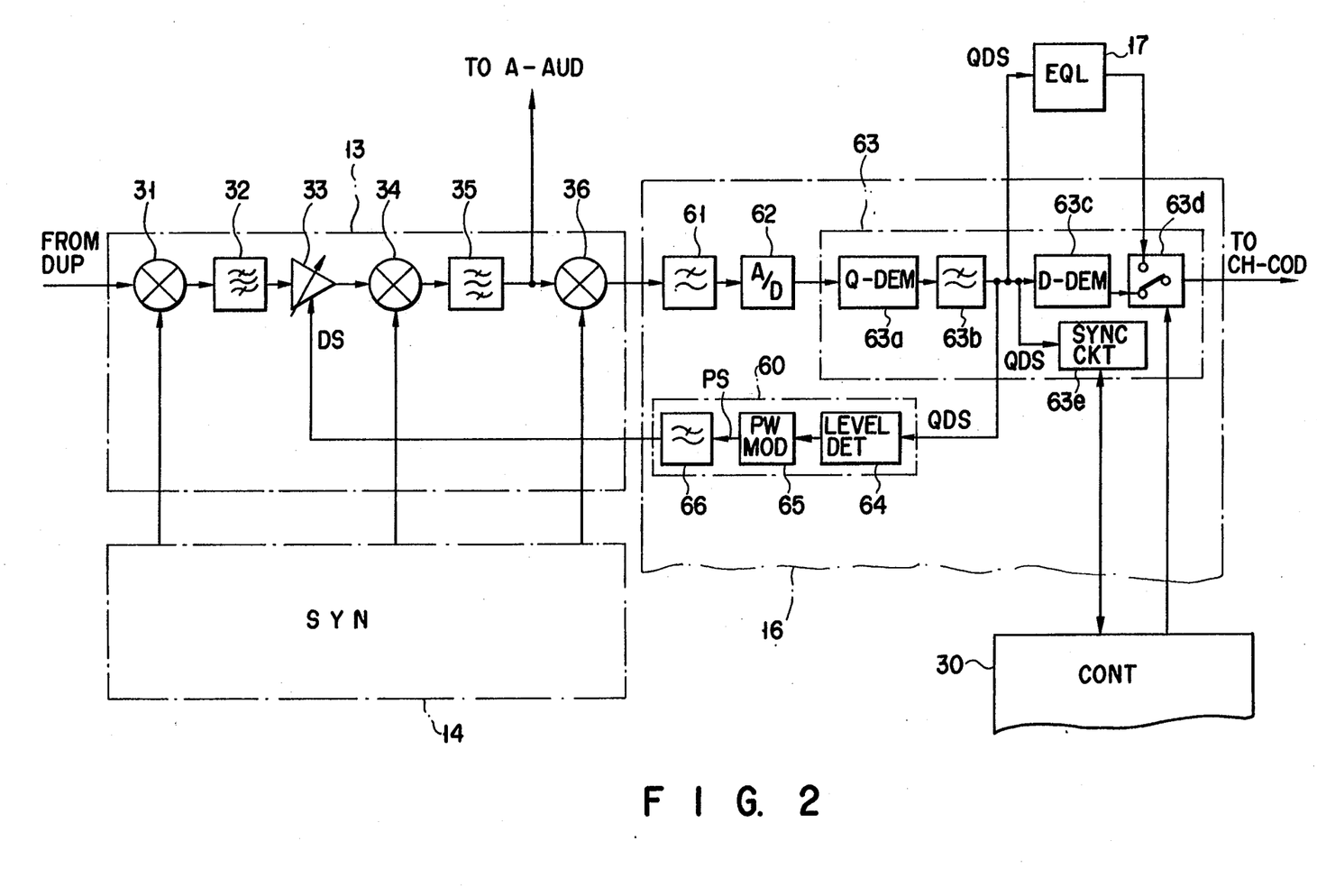
FIG. 2 is a block diagram showing the construction of the main portion of a reception circuit system of the mobile tele-communication device shown in FIG. 1.

FIG. 2 shows the concrete construction of the reception circuit system of the mobile radio communication device shown in FIG. 1.

The reception circuit 13 includes a first mixer 31, first intermediate frequency filter 32, second mixer 34, second intermediate frequency filter 35, and third mixer 36. The first mixer 31 and first intermediate frequency filter 32 are combined to constitute a first frequency converter. The first frequency converter converts a received high frequency signal into a first intermediate frequency signal. The second mixer 34 and second intermediate frequency filter 35 are combined to constitute a second frequency converter. The second frequency converter converts a first intermediate frequency signal into a second intermediate frequency signal having a lower frequency. The third mixer 36 constitutes a third frequency converter. The third frequency converter converts the second intermediate frequency signal into a third intermediate frequency signal having a still lower frequency. Further, a variable gain amplifier 33 is connected between the first intermediate frequency filter 32 and the second mixer 34. The gain of the variable gain amplifier 33 is controlled by a gain control signal DS output from a gain control circuit 60 as will be described later.

The demodulation system of the digital modulation/demodulation circuit 16 includes a low-pass filter 61, analog/digital (A/D) converter 62, demodulating section 63, and gain control circuit 60. The demodulating section 63 includes a quadrature demodulator (Q-DEM) 63a, low-pass filter 63b, delay detector (D-DEM) 63c, switching circuit 63d, and synchronizing circuit 63e. In the quadrature demodulator 63a, the third intermediate frequency signal which is converted into a digital form by the A/D converter 62 is subjected to the quadrature demodulation and converted into a signal of base band frequency. The digital demodulation signal QDS derived by the quadrature demodulation is input to the delay detector 63c and synchronizing circuit 63e after unnecessary high frequency components thereof are removed by means of the low-pass filter 63b. In the delay detector 63c, the digital demodulation signal QDS is delayed and detected so as to reproduce base band data. The synchronizing circuit 63e reproduces a clock signal from the digital demodulation signal QDS and detects a slot synchronizing signal. The pulling-in operation of the slot synchronization is effected based on the detection timing of the slot synchronizing signal. The switching circuit 63d is operated according to a switching signal supplied from the control circuit 30 so as to permit one of the base band data output from the delay detector 63c and data output from the equalizer 17 to be selectively supplied to the error correction code demodulating circuit 18.

The gain control circuit 60 includes a level detection circuit 64, pulse width modulation circuit (PWMOD) 65, and low-pass filter 66. In the level detection circuit 64, the amplitude level of the digital demodulation signal QDS output from the low-pass filter 63b of the demodulating section 63 is detected. The pulse width modulation circuit 65 is constructed by use of flip-flops, for example. In the pulse width modulation circuit 65, the pulse width of a pulse signal generated in a predetermined cycle is modulated according to the detected value output from the level detection circuit 64. In the low-pass filter 66, a pulse width modulation signal PS output from the pulse width modulation circuit 65 is smoothed and converted into a D.C. voltage. The D.C. voltage is supplied as a gain control signal DS to the control signal input terminal of the variable gain amplifier 33. The gain of the variable gain amplifier 33 is changed to a value corresponding to the D.C. voltage level of the gain control signal DS.

Next, the operation of the reception circuit system of the mobile radio communication device with the above construction is explained. A radio frequency signal (800 MHz) received by the antenna 11 is frequency-converted into a first intermediate frequency signal (83.16 MHz) by means of the first mixer 31 and first intermediate frequency filter 32. Then, the amplitude level thereof is controlled by the variable gain amplifier 33. The first intermediate frequency signal subjected to the above level control is frequency-converted into a second intermediate frequency signal (450 KHz) by means of the second mixer 34 and second intermediate frequency filter 35. Then, it is further frequency-converted into a signal of frequency (60 KHz) which can be subjected to the A/D conversion and digital signal process in the third mixer 36 and input to the digital modulation/demodulation circuit 16. In the digital modulation/demodulation circuit 16, the intermediate frequency signal supplied from the third mixer 36 is converted into a digital signal by means of the A/D converter 62 after unnecessary high frequency components thereof are removed by the low-pass filter 61 and is then input to the demodulating section 63. In the demodulating section 63, the digital intermediate frequency signal is subjected to the quadrature demodulation by means of the quadrature demodulator 63a and then converted into a digital demodulation signal QDS via the low-pass filter 63b. The digital demodulation signal QDS is subjected to the delayed detection by the delay detector 63c or to the signal waveform equalization by the equalizer 17 and converted into base band data and the base band data output from one of the delay detector 63c and the equalizer 17 is supplied to the error correction code demodulation circuit 18 via the switching circuit 63d.

In the gain control circuit 60, the amplitude level of the digital demodulation signal QDS is first detected by means of the level detection circuit 64. Then, the pulse width of the pulse signal is modulated according to the detected value of the amplitude level. The pulse signal PS subjected to the pulse width modulation is smoothed in the low-pass filter 66 and converted into a D.C. voltage. The D.C. voltage is supplied as a gain control signal DS to the control signal input terminal of the variable gain amplifier 33. As a result, the gain of the variable gain amplifier 33 is controlled to a value corresponding to the D.C. voltage level of the gain control signal DS.

Figure 3A:
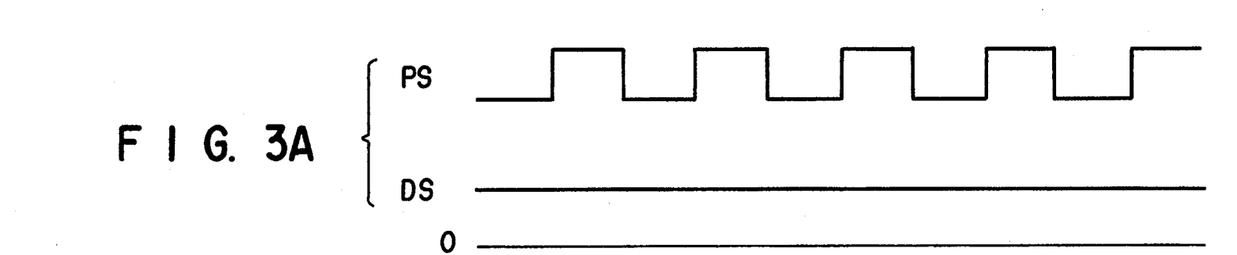
FIGS. 3A to 3C are a signal waveform diagram for illustrating the variable gain control operation of the reception circuit system shown in FIG. 2.

Suppose now that there occurs no influence due to fading or environmental variation. In this condition, an intermediate frequency signal of normal amplitude level is input to the digital modulation/demodulation circuit 16. In this case, a digital demodulation signal QDS with normal amplitude level output from the low-pass filter 63b of the demodulating section 63 is input to the level detection circuit 64 of the gain control circuit 60. As a result, a detected value corresponding to the normal amplitude level of the digital demodulation signal QDS is output from the level detection circuit 64 and is input to the pulse width modulation circuit 65. Therefore, a pulse width modulation signal PS with a duty cycle of 50% as shown in FIG. 3A, for example, is output from the pulse width modulation circuit 65. The pulse width modulation signal PS is smoothed and converted into a D.C. voltage in the low-pass filter 66 and the D.C. voltage is supplied as the gain control signal DS to the variable gain amplifier 33. As a result, the gain of the variable gain amplifier 33 is set to a standard value corresponding to the D.C. voltage level of the gain control signal DS.

Figure 3B:
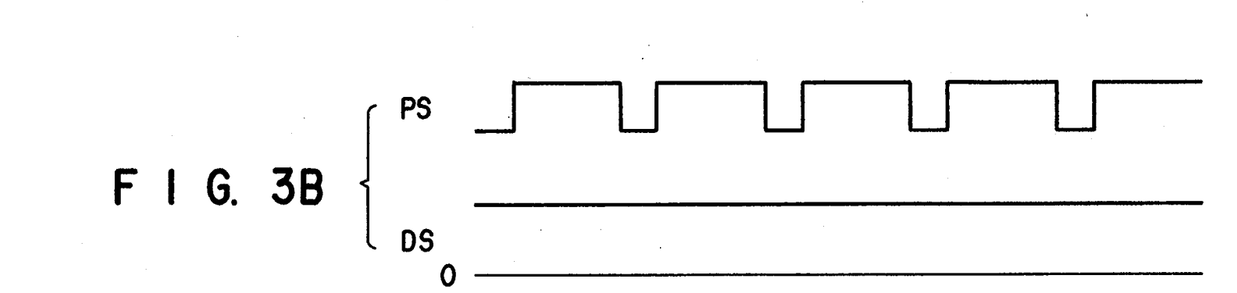

Assume now that, for example, fading occurs in this condition and the amplitude level of the received intermediate frequency signal is lowered by the influence of the fading. Then, the amplitude level of the digital demodulation signal QDS output from the low-pass filter 63b of the demodulating section 63 is lowered. Reduction in the amplitude level is detected by the level detection circuit 64 of the gain control circuit 60. Therefore, a pulse width modulation signal PS having an increased duty cycle as shown in FIG. 3B, for example, is output from the pulse width modulation circuit 65. A gain control signal DS having a D.C. voltage level raised according to the duty cycle of the pulse width modulation signal PS is output from the low-pass filter 66. As a result, the gain of the variable gain amplifier 33 is increased and the amplitude level of the intermediate frequency signal is enhanced. Therefore, lowering in the amplitude level of the intermediate frequency signal due to the fading can be compensated.

Figure 3C:
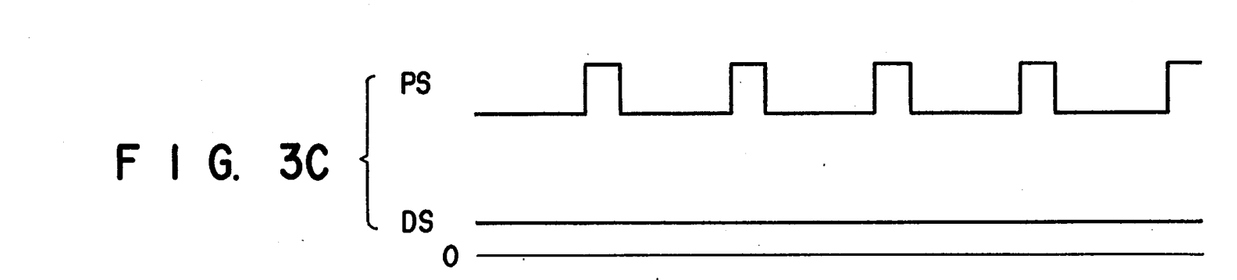

Assume that the gain of the reception circuit system is increased by a rise in the ambient temperature, for example. In this case, the amplitude level of the received intermediate frequency signal is raised. Then, the amplitude level of the digital demodulation signal QDS output from the low-pass filter 63b of the demodulator 63 is raised. A rise in the amplitude level is detected by the level detection circuit 64. The duty cycle of the pulse width modulation signal PS output from the pulse width modulation circuit 65 is decreased as shown in FIG. 3C, for example, according to the detected value of the amplitude level. As a result, the D.C. voltage level of the gain control signal DS output from the low-pass filter 66 is lowered and the gain of the variable gain amplifier 33 is decreased accordingly. Therefore, an increase in the gain of the reception circuit system due to the rise in the ambient temperature can be compensated, and as a result, the amplitude level of the received intermediate frequency signal is stabilized.

Thus, according to this embodiment, since the pulse width modulation circuit 65 is used as a means for generating a gain control signal in the gain control circuit, the circuit scale of the gain control circuit can be made small while the same dynamic range as that obtained in a case where the conventional D/A converter is used is attained. Further, the number of pins of an integrated circuit used when the digital modulation/demodulation circuit 16 is formed in an integrated circuit configuration can be reduced, and as a result, the circuit construction can be made simple and small. Therefore, the mobile communication device can be made smaller and lighter. In addition, the power consumption of the gain control circuit can be reduced. Therefore, the service life of the battery can be elongated so as to extend the continuous operation time or the capacity of the battery can be reduced to make the battery small so as to further reduce the size and weight of the mobile radio tele-communication device.

(SECOND EMBODIMENT)

Figure 4:
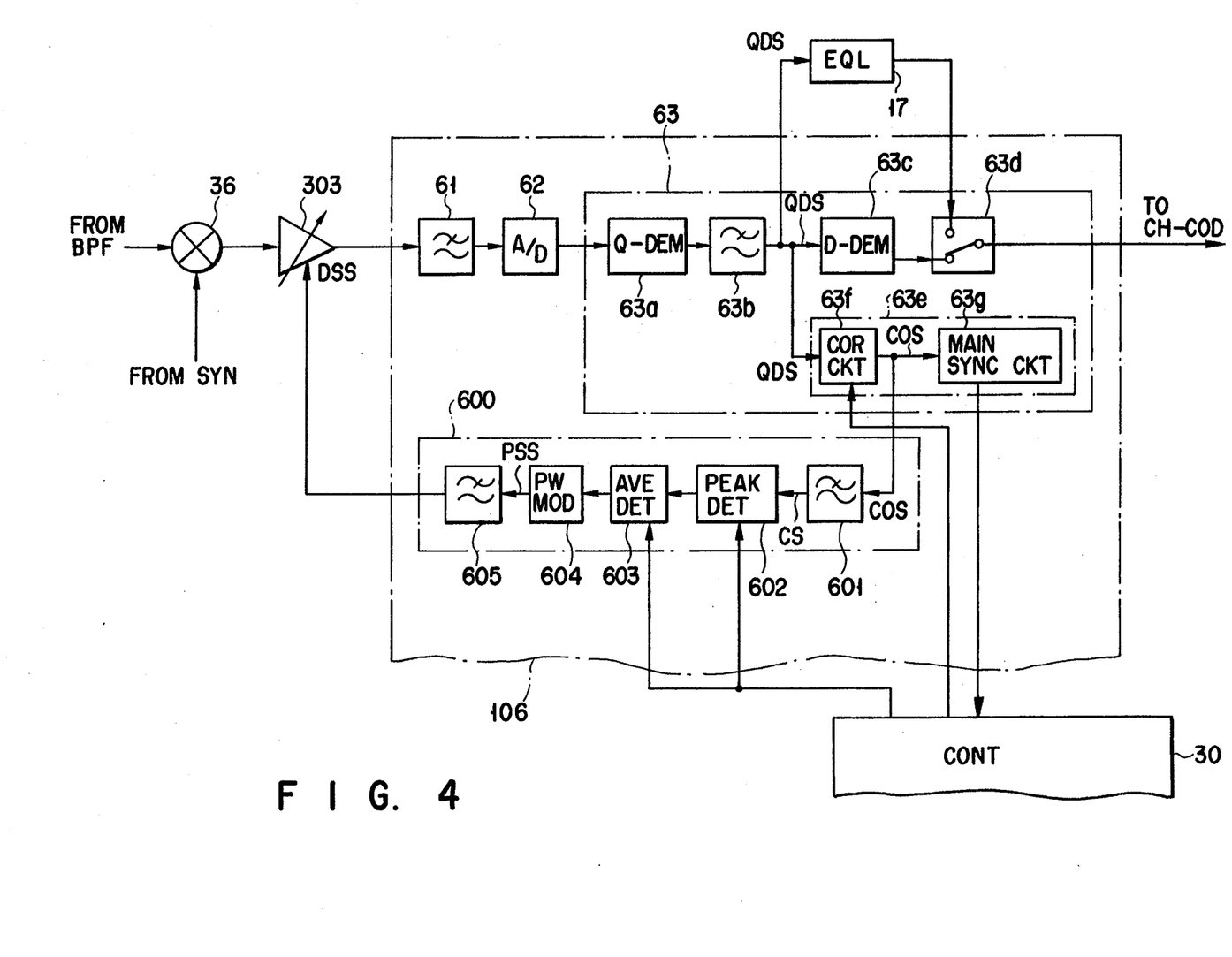
FIG. 4 is a block diagram showing the main portion of a reception circuit system of a mobile radio tele-communication device having a variable gain control circuit according to a second embodiment of this invention.

FIG. 4 is a block diagram showing the construction of the main portion of a reception circuit system of a mobile radio tele-communication device according to a second embodiment of this invention. Portions in FIG. 4 which are the same as those used in FIG. 2 are denoted by the same reference numerals and the detailed explanation therefor is omitted.

A variable gain amplifier 303 is connected between a third mixer 36 and a low-pass filter 61 of a digital modulation/demodulation circuit 106. A synchronizing circuit 63e provided in a demodulating section 63 of the digital modulation/demodulation circuit 106 includes a correlation circuit 63f and a synchronizing circuit main section 63g. The correlation circuit 63g is used to detect a slot synchronizing signal contained in a digital demodulation signal QDS output from the low-pass filter 63b and is constructed by a finite impulse response (FIR) filter.

Figure 5:
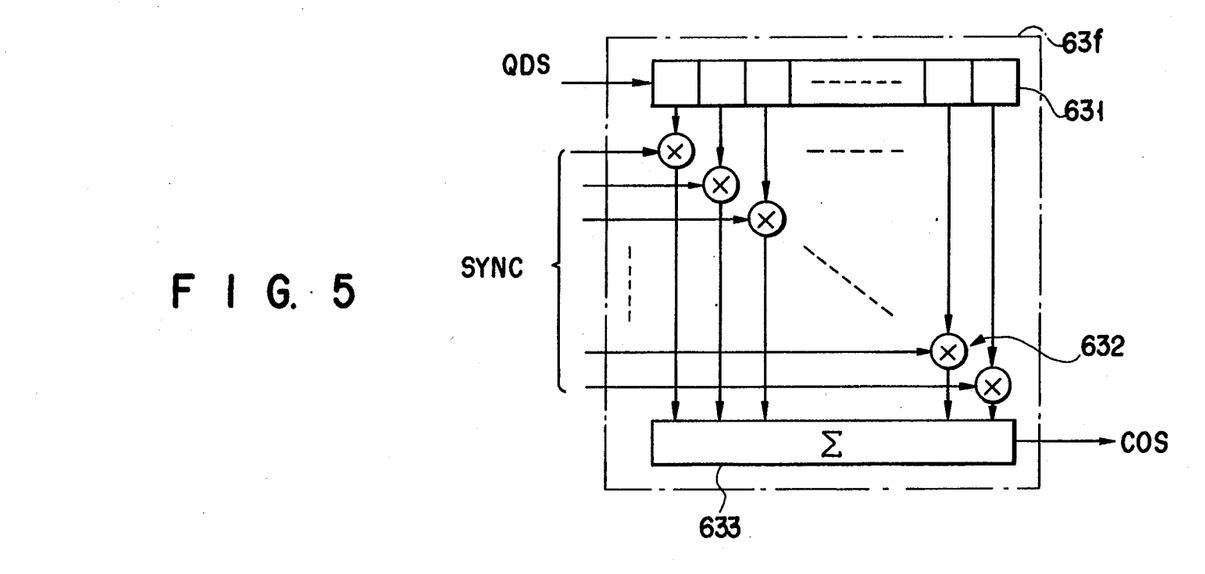
FIG. 5 is a circuit diagram showing the construction of a correlation circuit shown in FIG. 4.

FIG. 5 shows one example of the construction of the FIR filter. The FIR filter includes a shift register 631, a plurality of multipliers 632 and an adder 633. The shift register 631 has bits of a number corresponding to the number of digits of a slot synchronizing signal. The digital demodulation signal QDS is serially input to and shifted in the shift register 631. Each time the digital demodulation signal QDS is input by one bit, bits of the digital demodulation signal QDS stored therein are output in parallel from the shift register 631. In each of the multipliers 632, a corresponding one of the bits of the digital demodulation signal QDS output in parallel from the shift register 631 is multiplied by a corresponding one of the bits of the slot synchronizing signal SYNC of a reception slot supplied from the control circuit 30. In the adder 633, multiplied values output from the multipliers 632 are added together and the addition signal COS is input to the synchronizing circuit main section 63g.

That is, in the FIR filter, when the slot synchronizing signal of the reception slot is input to the shift register 631, an addition signal COS having the maximum value is output. The synchronizing circuit main section 63g effects operations to set up the slot synchronization based on the addition signal COS output from the correlation circuit 63f.

The gain control circuit 600 includes a low-pass filter 601, peak detector 602, averaging circuit 603, pulse width modulation circuit 604 and low-pass filter 605. The low-pass filter 601 serves to remove unnecessary high-frequency components contained in the addition signal COS output from the correlation circuit 63f. The peak detector 602 detects the peak value of the addition signal COS output from the low-pass filter 601 in synchronism with a timing signal supplied from the control circuit 30 for each frame. Each time a peak value of one frame is detected by the peak detector 602, the averaging circuit 603 stores and holds the peak value together with peak values detected in a plurality of preceding frames. An average value of the peak values in the plurality of frames is derived and supplied to the pulse width modulation circuit 604. The pulse width modulation circuit 604 modulates the pulse width of a pulse signal generated in a predetermined cycle according to the average peak value supplied from the averaging circuit 603. The low-pass filter 66 serves to smooth the pulse signal PSS which is output from the pulse width modulation circuit 604 and whose pulse width is modulated so as to convert the same into a D.C. voltage. The thus obtained D.C. voltage is supplied as a gain control signal DSS to the control signal input terminal of the variable gain amplifier 303. The gain of the variable gain amplifier 303 is changed to a value corresponding to the D.C. voltage level of the gain control signal DSS.

Next, the operation of the reception circuit system of the mobile radio communication device with the above construction is explained. A received intermediate frequency signal output from the third mixer 36 is input to the digital modulation/demodulation circuit 106 after the amplitude level thereof is controlled by the variable gain amplifier 303. In the digital modulation/demodulation circuit 106, the received intermediate frequency signal supplied from the variable gain amplifier 303 is converted into a digital signal by the A/D converter 62 and input to the demodulating section 63 after unnecessary high-frequency components thereof are removed by the low-pass filter 61. In the demodulating section 63, the digital intermediate frequency signal is subjected to the quadrature demodulation by the quadrature demodulator 63a and then converted into a digital demodulation signal QDS via the low-pass filter 63b. In the synchronizing circuit 63e, a slot synchronizing signal contained in the digital demodulation signal QDS is detected by the correlation circuit 63f and the operation of setting up the slot synchronization is effected based on an output signal COS thereof by the synchronizing circuit main section 63g.

Figure 6:
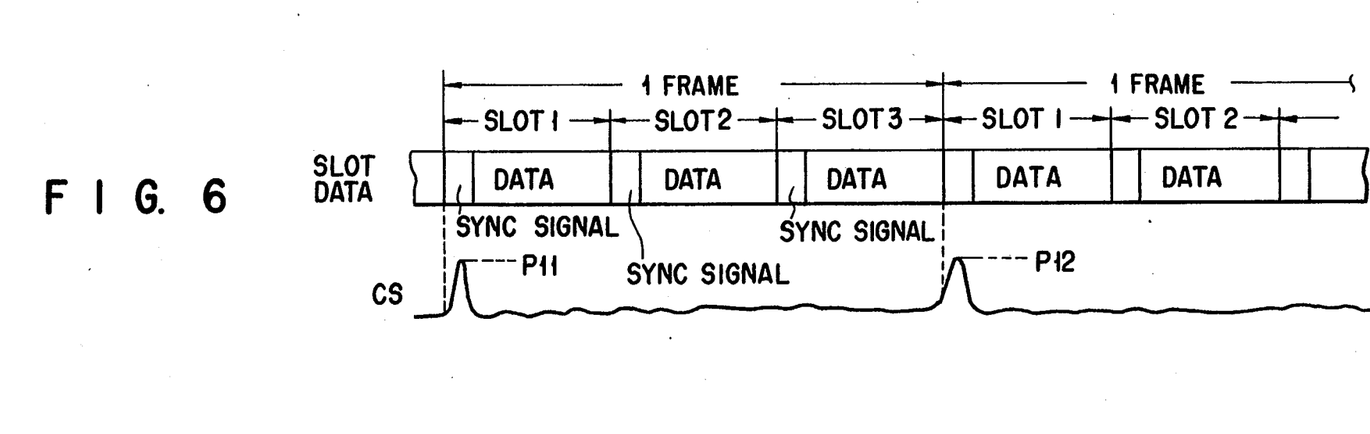
FIG. 6 is a signal waveform diagram used for explaining the operation of the correlation circuit shown in FIG. 5.

At this time, in the gain control circuit 600, the peak value of a signal OS output from the correlation circuit 63f for each reception frame and then supplied via the low-pass filter 601 is detected by the peak detector 602. The detected peak value is temporarily stored into the averaging circuit 603 together with peak values detected in a plurality of preceding frames. In the averaging circuit 603, an average value of the stored peak values is derived. Assuming now that the reception slot is slot 1, for example, the peak value occurs in the reception position of a slot synchronizing signal of the slot 1 as shown in FIG. 6 in the output signal of the correlation circuit 63f. Then, the peak values P11, P12, - - - are detected by the peak detector 602. In the averaging circuit 603, each time one of the peak values is detected, an average value of the peak values of the preceding four frames containing the detected peak value is derived.

In the pulse width modulation circuit 65, the pulse width of a pulse signal is modulated according to the average peak value derived by the averaging circuit 603. The pulse signal PSS whose pulse width is modulated is smoothed by the low-pass filter 66 and converted into a D.C. voltage. The D.C. voltage is supplied as a gain control signal DSS to the control signal input terminal of the variable gain amplifier 303. As a result, the gain of the variable gain amplifier 33 is changed to a value corresponding to the D.C. voltage level of the gain control signal DSS.

Therefore, if fading occurs in the radio channel, for example, and the amplitude level of the received intermediate frequency signal is lowered by the influence of the fading, then the amplitude level of the digital demodulation signal QDS output from the low-pass filter 63b of the demodulating section 63 is lowered. Further, when the amplitude level of the digital demodulation signal QDS is lowered, the peak value of a signal output from the correlation circuit 63f of the synchronizing circuit 63e is also lowered. Reduction in the peak value is detected by the peak detector 602 of the gain control circuit 60. When the amplitude level of the digital demodulation signal QDS is lowered over a plurality of frames, the average peak value output from the averaging circuit 603 is significantly lowered. As a result, a pulse width modulation signal PSS whose duty cycle is increased according to the reduction in the average peak value is output from the pulse width modulation circuit 604. Therefore, a gain control signal DSS whose D.C. voltage level is raised according to the duty cycle of the pulse width modulation signal PSS is output from the low-pass filter 605. Thus, the gain of the variable gain amplifier 303 is increased and the amplitude level of the intermediate frequency signal is raised. As a result, reduction in the amplitude level of the intermediate frequency signal due to fading can be compensated.

Assume that the gain of the reception circuit system is increased by a rise in the ambient temperature or the like. In this case, the amplitude level of the received intermediate frequency signal is raised. Then, the amplitude level of the digital demodulation signal QDS output from the low-pass filter 63b of the demodulating section 63 is raised. When the amplitude level of the digital demodulation signal QDS is raised, the peak value of a signal output from the correlation circuit 63f of the synchronizing circuit 63e is also increased. An increase in the peak value is detected by the peak detector 602 of the gain control circuit 60. When the amplitude level of the digital demodulation signal QDS is raised over a plurality of frames, the average peak value output from the averaging circuit 603 is significantly increased. As a result, a pulse width modulation signal PSS whose duty cycle is reduced according to an increase in the average peak value is output from the pulse width modulation circuit 604. Therefore, the D.C. voltage level of the gain control signal DSS output from the low-pass filter 605 is lowered and the gain of the variable gain amplifier 303 is lowered accordingly. Thus, an increase in the gain of the reception circuit system caused by a rise in the ambient temperature is compensated, and as a result, the amplitude level of the received intermediate frequency signal can be stabilized.

As described above, according to this embodiment, like the first embodiment, since the pulse width modulation circuit 604 is used as a means for generating a gain control signal in the gain control circuit, the circuit scale of the gain control circuit can be made small to reduce the size and weight of the radio communication device while the same dynamic range as that obtained in a case where the conventional D/A converter is used is attained. Further, the power consumption of the gain control circuit can be reduced, and therefore, the service life of the battery can be elongated so as to extend the continuous operation time or the capacity of the battery can be reduced to make the battery small so as to further reduce the size and weight of the mobile radio tele-communication device.

Further, in this embodiment, since the peak value of a signal output from the correlation circuit 63f is detected by the peak detector 602 and the gain control signal DSS is derived based on the detected peak value, the amplitude level of the digital demodulation signal QDS can be detected with higher sensitivity in comparison with a case wherein the amplitude level of the digital demodulation signal QDS is directly detected. In this case, since the correlation circuit 63f is already provided in the synchronizing circuit 63e, it is not necessary to add various circuits for detecting the peak value.

Further, in this embodiment, since an average value of peak values detected in a plurality of frames is derived by means of the averaging circuit 603 and the gain control signal DSS is derived based on the average value, the gain control signal DSS can be prevented from being varied in response to temporary variation in the peak value of an output signal of the correlation circuit 63f even when the peak value of the output signal is temporarily significantly changed by introduction of noises or interruption of radio waves, for example. As a result, the gain control can be effected more stably.

According to this embodiment, since the variable gain amplifier 303 is provided in the succeeding stage of the third mixer 36 so as to change the amplitude level of the third intermediate frequency signal, it is not necessary to use a high-frequency amplifier as the variable gain amplifier 303. Therefore, the variable gain amplifier 303 can be formed of a relatively simple circuit and the power consumption thereof can be reduced.

This invention is not limited to the above embodiments. For example, in the above embodiments, the amplitude level of the digital demodulation signal QDS or the peak value of an output signal of the correlation circuit 63f is detected and a gain control signal is derived based on the detected value. However, it is also possible to detect variation in the amplitude level of the peak value with respect to a reference value and then derive a gain control signal whose D.C. voltage level changes according to the detected variation amount. Further, when a smoothing means for a gain control signal is provided in the variable gain amplifier, the low-pass filter of the gain control circuit can be omitted. It is possible to use a variable attenuator instead of the variable gain amplifier as the level changing means. In addition, the position of connection of the variable gain amplifier, the circuit construction of the pulse width modulation circuit, and the type and construction of the radio tele-communication device to be applied can be variously changed without departing from the technical scope of this invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A radio-telecommunication device comprising:
   frequency-converting means for receiving a radio signal transmitted via a radio channel and for frequency-converting the received radio signal into a signal having a frequency lower than the received radio signal;
   variable gain-type level changing means, responsive to a gain control signal, for permitting the amplitude of the signal derived from said frequency converting means to be changed;
   demodulating means for demodulating the signal output from said level changing means to produce a digital base band signal as a first output signal, said demodulating means comprising converting means for converting the signal output from said level changing means into a digital signal, means for performing a digital demodulation of the digital signal to produce a demodulated signal, and outputting means for outputting a second output signal obtained from the demodulated signal;
   level detecting means for detecting amplitude information corresponding to the amplitude level of the signal output from said level changing means based on the second output signal from said outputting means;
   pulse width modulation means for generating a pulse signal whose pulse width is modulated according to the detected amplitude information; and
   gain control signal generating means for generating a gain control signal having a D.C. level corresponding to the pulse width of the pulse signal and for supplying the gain control signal to said level changing means to control the gain thereof.

2. A radio tele-communication device according to claim 1, wherein said frequency converting means includes a plurality of series-connected frequency converting circuits and said level changing means is coupled to a last-stage frequency converting circuit among said plurality of frequency converting circuits.

3. A radio tele-communication device according to claim 1, wherein said outputting means includes synchronizing signal detecting means for detecting preset synchronizing signals periodically set in said radio signal and outputting the detected signals, and said level detecting means detects the peak value of the detected signals output from said synchronizing signal detecting means and outputting the detected peak value as said amplitude information.

4. A radio tele-communication device according to claim 1, wherein said demodulation means includes synchronizing signal detecting means for detecting preset synchronizing signals periodically set in said radio signal and outputting the detected signals, and said level detecting means includes peak value detecting means for detecting the peak values of detected signals output from said synchronizing signal detecting means and means for deriving an average value of a plurality of peak values detected by said peak value detecting means and outputting the average value as said amplitude information.

5. A variable gain control circuit provided in a device having a digital processing circuit for converting an input signal into a digital signal and then demodulating the digital signal, comprising:

level changing means preceding said digital processing circuit, for changing the amplitude level of a signal supplied thereto to produce an output signal having a changed amplitude level and supplying the output signal to said digital processing circuit as an input signal;

level detecting means for detecting amplitude information corresponding to the amplitude level of the output signal of said level changing means based on the digital signal;

pulse width modulation means for outputting a pulse signal whose pulse width is modulated according to the amplitude information detected by said level detecting means; and gain control means for generating a gain control signal having a D.C. level corresponding to the pulse width of the pulse signal output from said pulse width modulation means and for controlling the gain of said level changing means according to the gain control signal.

6. A variable gain controlling method applied to a device having a digital processing circuit for converting an input signal into a digital signal and then subjecting the same to a predetermined processing, comprising the steps of:

changing the amplitude level of a signal by use of a level changing means to produce an output signal having a changed amplitude level and supplying the output signal to said digital processing circuit as an input signal;

detecting amplitude information corresponding to the amplitude level of the output signal from said level changing means based on the digital signal;

outputting a pulse signal whose pulse width is modulated according to the detected amplitude information;

generating a gain control signal having a D.C. level corresponding to the pulse width of the pulse signal; and controlling the gain level of said level changing means according to the D.C. level of the gain control circuit.

7. A radio-telecommunication device comprising:

a frequency converter for frequency-converting a received radio signal having a first carrier frequency into a frequency-converted radio signal having a second carrier frequency lower than the first carrier frequency;

a variable gain amplifier, responsive to a gain control signal, for amplifying the frequency-converted radio signal;

an analog-to-digital converter for converting the amplified frequency-converted radio signal to a digital signal;

a demodulator for demodulating the digital signal to produce a demodulated digital signal;

a level detector for detecting amplitude information corresponding to the amplitude level of the amplified frequency-converted radio signal based on the demodulated digital signal;

a pulse width modulator for generating a pulse signal whose pulse width is modulated according to the detected amplitude information; and gain control signal generation means for generating a gain control signal having a level corresponding to the pulse width of the pulse signal, wherein the gain control signal is supplied to said variable gain amplifier to control the gain thereof.

8. The radio-telecommunication device according to claim 7, wherein said demodulator comprises a quadrature demodulator.

9. The radio-telecommunication device according to claim 8, further comprising a delay detector for generating base band data from the demodulated digital signal and for outputting the base band data to an error correction demodulating circuit.

10. The radio-telecommunication device according to claim 9, further comprising a synchronizing circuit for detecting a slot synchronization signal from the demodulated digital signal.

11. A radio-telecommunication device comprising:

a frequency converter for frequency-converting a received radio signal having a first carrier frequency into a frequency-converted radio signal having a second carrier frequency lower than the first carrier frequency;

a variable gain amplifier, responsive to a gain control signal, for amplifying the frequency-converted radio signal;

an analog-to-digital converter for converting the amplified frequency-converted radio signal to a digital signal;

a demodulator for demodulating the digital signal to produce a demodulated digital signal;

a correlation circuit for generating a correlation signal from the demodulated digital signal;

a peak detector for detecting peak values of said correlation signal;

an averaging circuit for generating an average peak value from the peak values detected by said peak detector;

a pulse width modulator for generating a pulse signal whose pulse width is modulated according to the average peak value; and gain control signal generation means for generating a gain control signal having a level corresponding to the pulse width of the pulse signal, wherein the gain control signal is supplied to said variable gain amplifier to control the gain thereof.

12. The radio-telecommunication device according to claim 11, wherein said demodulator comprises a quadrature demodulator.

13. The radio-telecommunication device according to claim 12, further comprising a delay detector for generating base band data from the demodulated digital signal and for outputting the base band data to an error correction demodulating circuit.

14. The radio-telecommunication device according to claim 13, wherein said correlation circuit detects a slot synchronizing signal in the demodulated digital signal.

15. The radio-telecommunication device according to claim 14, wherein said correlation circuit comprises a finite impulse response filter.

16. The radio-telecommunication device according to claim 15, further comprising a control circuit for outputting timing control signals, and wherein said peak detector detects the peak value of the correlation signal in synchronism with the timing control signals.

17. The radio-telecommunication device according to claim 11, wherein said correlation circuit detects a slot synchronizing signal in the demodulated digital signal.

18. The radio-telecommunication device according to claim 13, wherein said correlation circuit comprises a finite impulse response filter.

19. The radio-telecommunication device according to claim 11, further comprising a control circuit for outputting timing control signals, and wherein said peak detector detects the peak value of the correlation signal in synchronism with the timing control signals.

* * * * *